United States Patent
Madrid

(10) Patent No.: US 8,193,622 B2
(45) Date of Patent: Jun. 5, 2012

(54) THERMALLY ENHANCED THIN SEMICONDUCTOR PACKAGE

(75) Inventor: Ruben P. Madrid, Talisay (PH)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 12/717,012

(22) Filed: Mar. 3, 2010

(65) Prior Publication Data
US 2010/0155913 A1 Jun. 24, 2010

Related U.S. Application Data

(60) Continuation of application No. 11/845,560, filed on Aug. 27, 2007, now abandoned, and a continuation-in-part of application No. 12/499,893, filed on Jul. 9, 2009, now Pat. No. 7,816,178, which is a division of application No. 11/364,399, filed on Feb. 28, 2006, now Pat. No. 7,576,429.

(60) Provisional application No. 60/755,241, filed on Dec. 30, 2005.

(51) Int. Cl.
*H01L 23/02* (2006.01)
*H01L 23/48* (2006.01)

(52) U.S. Cl. ........ 257/678; 257/666; 257/671; 257/673; 257/676; 257/E21.054; 257/E23.044; 257/E23.124; 257/E23.034; 257/E33.001; 438/108; 438/123; 438/124; 438/127

(58) Field of Classification Search .................. 257/666, 257/671, 673, 676, 678, E21.054, E23.034, 257/E23.044, E23.124, E33.001; 438/108, 438/123, 124, 127
See application file for complete search history.

(56) References Cited

U.S. PATENT DOCUMENTS

| | | | |
|---|---|---|---|
| 6,777,800 B2 * | 8/2004 | Madrid et al. ................. | 257/690 |
| 6,989,588 B2 * | 1/2006 | Quinones et al. ............. | 257/680 |
| 6,992,385 B2 * | 1/2006 | Satou et al. .................... | 257/735 |
| 7,256,479 B2 * | 8/2007 | Noquil et al. ................. | 257/666 |
| 7,371,616 B2 * | 5/2008 | Jereza ............................ | 438/123 |
| 7,586,180 B2 * | 9/2009 | Hata et al. ...................... | 257/678 |
| 2005/0023658 A1 * | 2/2005 | Tabira et al. .................. | 257/678 |

OTHER PUBLICATIONS http://www.fusion-inc.com/solder-paste.htm (unknown date).*
http://www.indium.com/documents/applicationnotes/97773.pdf (unknown date).*
Office Action issued by the State Intellectual Property Office of the People's Republic of China in Application No. 2008-80105612.X, mailed Mar. 7, 2011, translation attached.

* cited by examiner

*Primary Examiner* — Dao H Nguyen
(74) *Attorney, Agent, or Firm* — Kilpatrick Townsend & Stockton LLP

(57) ABSTRACT

A semiconductor die package is disclosed. The semiconductor die package includes a semiconductor die comprising an input at a first top semiconductor die surface and an output at a second bottom semiconductor die surface. A leadframe having a first leadframe surface and a second leadframe surface opposite the first leadframe surface is in the semiconductor die package and is coupled to the first top semiconductor die surface. A clip having a first clip surface and a second clip surface is coupled to the second bottom semiconductor die surface. A molding material having exterior molding material surfaces covers at least a portion of the leadframe, the clip, and the semiconductor die. The first leadframe surface and the first clip surface are exposed by the molding material, and the first leadframe surface, the first clip surface, and the exterior molding material surfaces of the molding material form exterior surfaces of the semiconductor die package.

25 Claims, 18 Drawing Sheets

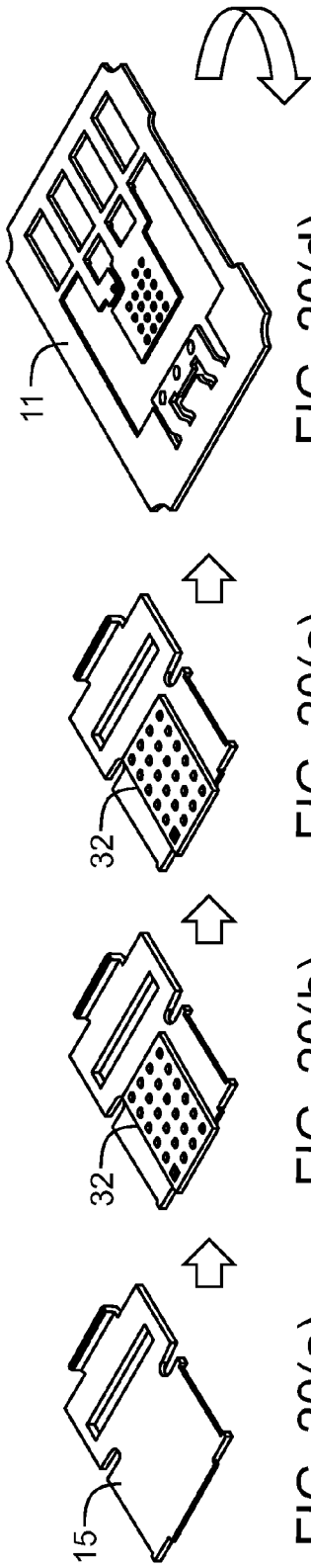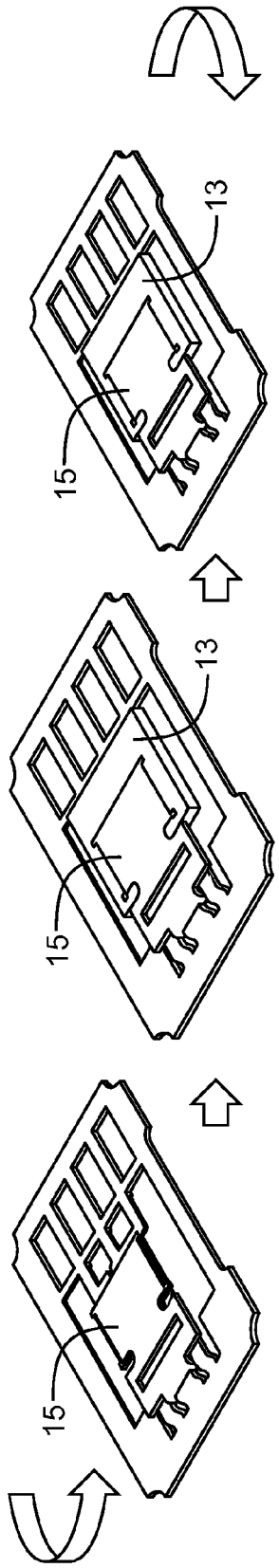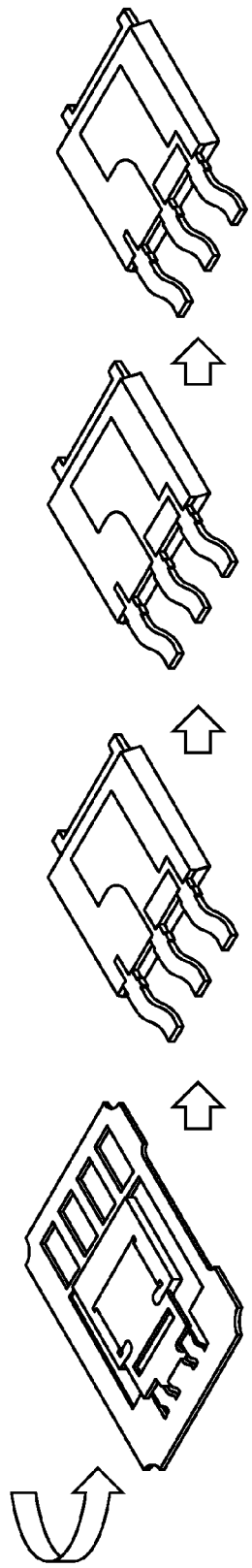

THERMALLY ENHANCED THIN SEMICONDUCTOR PACKAGE

CROSS-REFERENCES TO RELATED APPLICATIONS

This application is a continuation of prior U.S. patent application Ser. No. 11/845,560, filed Aug. 27, 2007, entitled "Thermally Enhanced Thin Semiconductor Package," currently pending, and a continuation-in-part of prior U.S. patent application Ser. No. 12/499,893, filed Jul. 9, 2009 entitled "PACKAGED SEMICONDUCTOR DEVICE WITH DUAL EXPOSED SURFACES AND METHOD OF MANUFACTURING," which is a divisional of prior U.S. patent application Ser. No. 11/364,399 filed Feb. 28, 2006, entitled "PACKAGED SEMICONDUCTOR DEVICE WITH DUAL EXPOSED SURFACES AND METHOD OF MANUFACTURING," now issued as U.S. Pat. No. 7,576,429, which claims the benefit of U.S. Provisional Patent Application No. 60/755,241 filed Dec. 30, 2005. All of the above applications are incorporated herein by reference for all purposes.

BACKGROUND

Semiconductor die packages are known in the semiconductor industry, but could be improved. For example, electronic devices such as wireless phones and the like are becoming smaller and smaller. It is desirable to make thinner semiconductor die packages so that they can be incorporated into such electronic devices. It would also be desirable to improve upon the heat dissipation properties of conventional semiconductor die packages.

Another technical challenge that exists is in the formation of such semiconductor die packages. A clip and a leadframe may sandwich a semiconductor die in an exemplary semiconductor die package. If the clip and the leadframe are not properly aligned with each other and the semiconductor die, then the manufactured semiconductor die package could be defective and rework may be needed.

Embodiments of the invention address these and other problems, individually and collectively.

BRIEF SUMMARY

Embodiments of the invention are directed to semiconductor die packages, methods for making semiconductor die packages, and assemblies and systems using such semiconductor die packages.

One embodiment of the invention is directed to a semiconductor die package. The semiconductor die package includes a semiconductor die comprising an input at a first top semiconductor die surface and an output at a second bottom semiconductor die surface. A leadframe having a first leadframe surface and a second leadframe surface opposite the first leadframe surface is in the semiconductor die package and is coupled to the first top semiconductor die surface. A clip having a first clip surface and a second clip surface is coupled to the second bottom semiconductor die surface. A molding material having exterior molding material surfaces covers at least a portion of the leadframe, the clip, and the semiconductor die. The first leadframe surface and the first clip surface are exposed by the molding material, and the first leadframe surface, the first clip surface, and the exterior molding material surfaces of the molding material form exterior surfaces of the semiconductor die package.

Another embodiment of the invention is directed to a method for forming a semiconductor die package. The method comprises obtaining a semiconductor die comprising an input at a first top semiconductor die surface and an output at a second bottom semiconductor die surface, and attaching a leadframe having a first leadframe surface and a second leadframe surface opposite the first leadframe surface to the semiconductor die. The second leadframe surface is coupled to the first top semiconductor die surface. A clip is attached to the second bottom semiconductor die surface. The clip has a first clip surface and a second clip surface. A molding material is molded around at least a portion of the leadframe, the clip, and the semiconductor die. After molding, the first leadframe surface and the first clip surface are exposed by the molding material. The first leadframe surface, the first clip surface, and the exterior molding material surfaces of the molding material form exterior surfaces of the semiconductor die package.

These and other embodiments of the invention are described in further detail below.

BRIEF DESCRIPTION OF THE DRAWINGS

FIGS. 20(a)-20(k) show portions of a semiconductor die package as it is being formed.

In the Figures, like numerals designate like elements, and the descriptions of like elements may not be repeated in some instances.

DETAILED DESCRIPTION

One embodiment of the invention is directed to a semiconductor die package. The semiconductor die package includes a semiconductor die comprising an input (e.g., a source region) at a first top semiconductor die surface and an output (e.g., a drain region) at a second bottom semiconductor die surface. A leadframe having a first leadframe surface and a second leadframe surface opposite the first leadframe surface is in the semiconductor die package and is coupled to the first top semiconductor die surface. A clip (e.g., a drain clip) having a first clip surface and a second clip surface is coupled to the second bottom semiconductor die surface. A molding material having exterior molding material surfaces covers at least a portion of the leadframe, the clip, and the semiconductor die. The first leadframe surface and the first clip surface are exposed by the molding material, and the first leadframe surface, the first clip surface, and the exterior molding material surfaces of the molding material may form exterior surfaces of the semiconductor die package.

Figure 1:
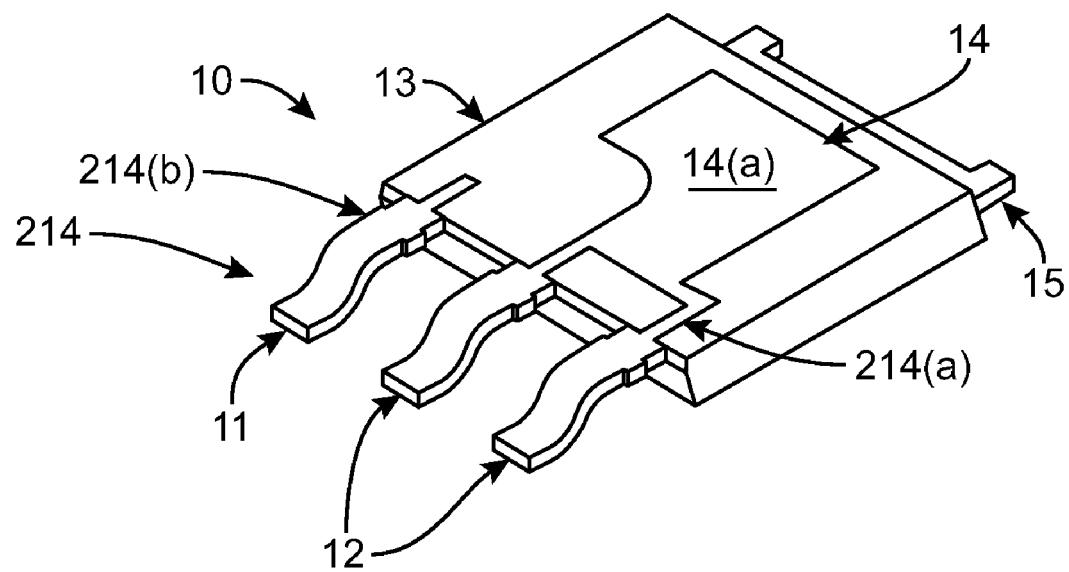
FIG. 1 shows a top perspective view of a semiconductor die package according to an embodiment of the invention.

FIG. 1 shows a top perspective view of a semiconductor die package 10 according to an embodiment of the invention. The semiconductor die package 10 comprises a leadframe 214 comprising a source lead structure 214(a) and a gate lead structure 214(b). The source lead structure 214(a) comprises a source pad 14, an exposed source surface 14(a) (which may be an example of at least part of a first leadframe surface), and source leads 12. The leadframe 214 may also comprise a gate lead structure comprising a gate lead 11. An exposed thermal clip 15 is also shown, and will be described in further detail below with respect to FIG. 2. A molding material 13 may be formed on at least a portion of the leadframe 214, the clip 215, and a semiconductor die (not shown) that lies between the leadframe 214 and the clip 15. The molding material 13 may be formed using any suitable material including an epoxy based molding material. If desired, a heatsink (not shown) could be placed on top of the surface 14(a) to improve heat dissipation properties.

As shown in FIG. 1, a top exterior surface of the molding material 13 of the semiconductor die package 10 is substantially coplanar with and exposes the exposed source pad surface 14(a). Extensions to the source leads 12 (as well as the gate lead 11) are also exposed by the molding material 13 in this example. Thus, the topmost surface of the package may be formed at least in part by the exposed source surface 14(a) and the top exterior surface of the molding material 13. This particular configuration results in a very thin semiconductor die package, with good heat dissipation properties. Heat can dissipate through the gate lead 11, the source lead 12, and the exposed thermal clip 15.

Figure 2:
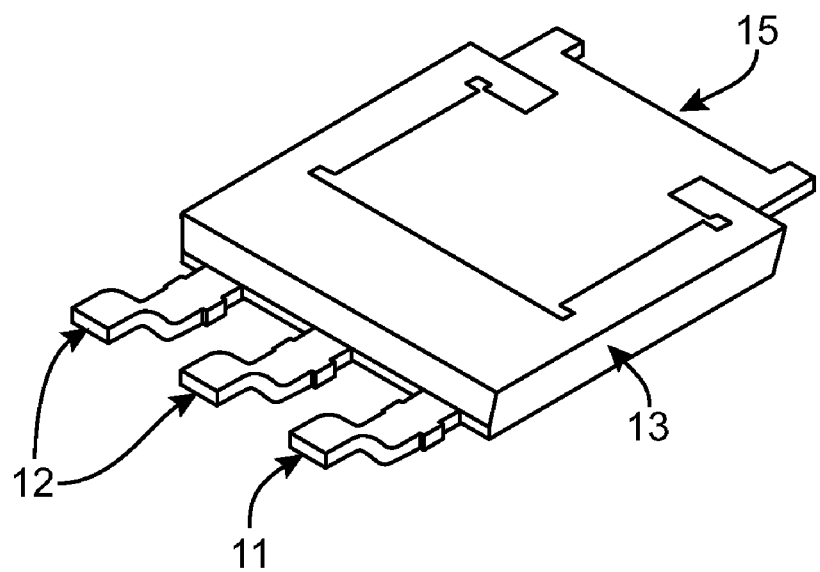
FIG. 2 shows a bottom perspective view of the semiconductor die package shown in FIG. 1.

FIG. 2 shows a bottom view of the semiconductor die package 10 shown in FIG. 1. As shown, a bottom clip surface 15(a) (which may be an example of a first clip surface) of the thermal clip 15 may be exposed by the molding material 13. The bottom clip surface 15(a) may be substantially coplanar with the bottom surface of the molding material 13. The ends of the leads 11, 12 may also be substantially coplanar with the bottom clip surface 15(a) so that the semiconductor die package 10 can be mounted to a printed circuit board or the like.

In the embodiment shown in FIG. 2, the leads 11, 12 may extend out of the molding material 13 from one end of the semiconductor die package 10, while a portion of the clip 15 may extend out of the molding material 13 from the opposite end of the semiconductor die package 10. Thus, the package 10 shown in FIG. 2 is a leaded package. In other embodiments of the invention, however, "leadless" packages could be produced. A leadless package may still include leads, but they may not extend past the lateral surfaces of the molding material 13 at all or to any appreciable degree.

Figure 3:
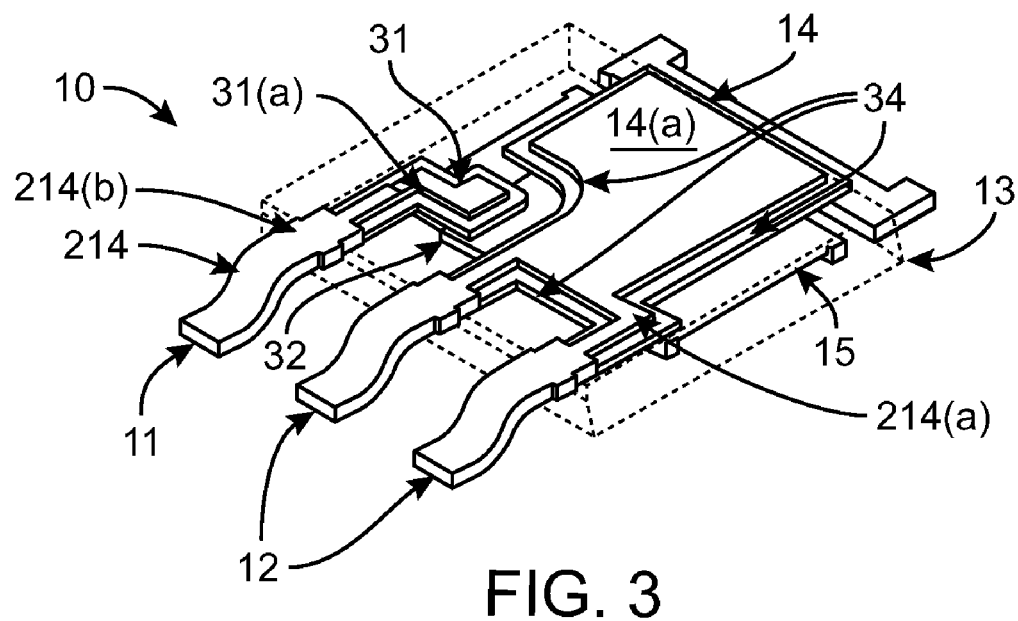
FIG. 3 shows a top perspective view of a semiconductor die package according to an embodiment of the invention with the outline of the molding material shown.
Figure 4:
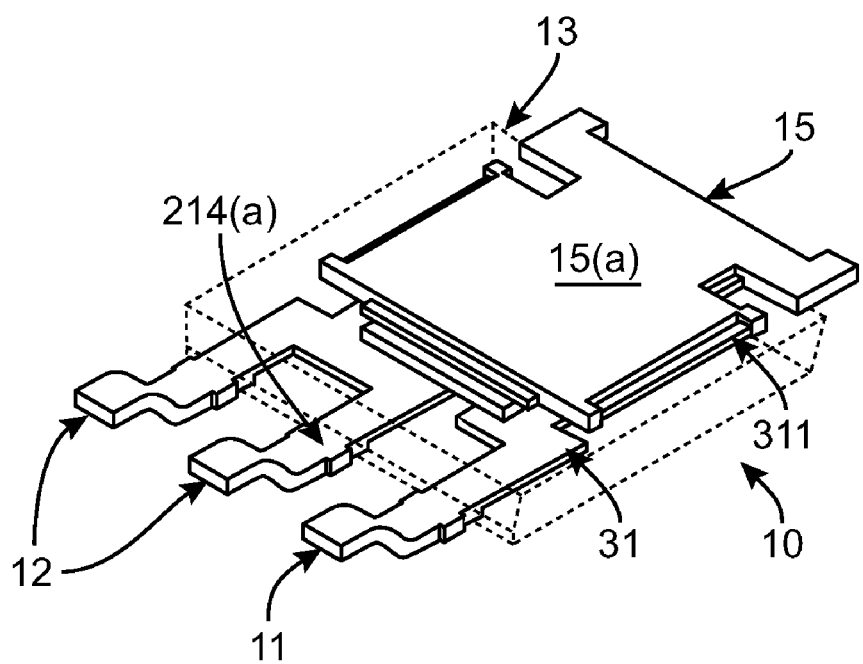
FIG. 4 shows a bottom perspective view of a semiconductor die package according to an embodiment of the invention with the outline of the molding material shown.

FIG. 3 is a top perspective view of the semiconductor die package shown in FIG. 1 with the outline of the molding material being shown by dotted lines. FIG. 4 shows a bottom perspective view of the semiconductor die package shown in FIG. 1 with the outline of the molding material being shown by dotted lines. FIGS. 3 and 4 more clearly show a leadframe comprising a gate lead structure 11 and a source lead structure 12. The gate lead structure 11 and the source lead structure 12 are electrically isolated from each other.

A semiconductor (e.g., silicon) die 32 is sandwiched between the leadframe and a thermal drain clip 15. The thermal clip 15 and the leadframe may be electrically coupled to an output region in the semiconductor die 32 in the semiconductor die package 10.

The leadframe 214 and the thermal drain clip 15 may be formed of any suitable electrically conductive material including copper, aluminum, noble metals and alloys thereof. The leadframe and the thermal drain clip 15 may also be plated with solderable layers (e.g., underbump metallurgy layers).

Figure 21:
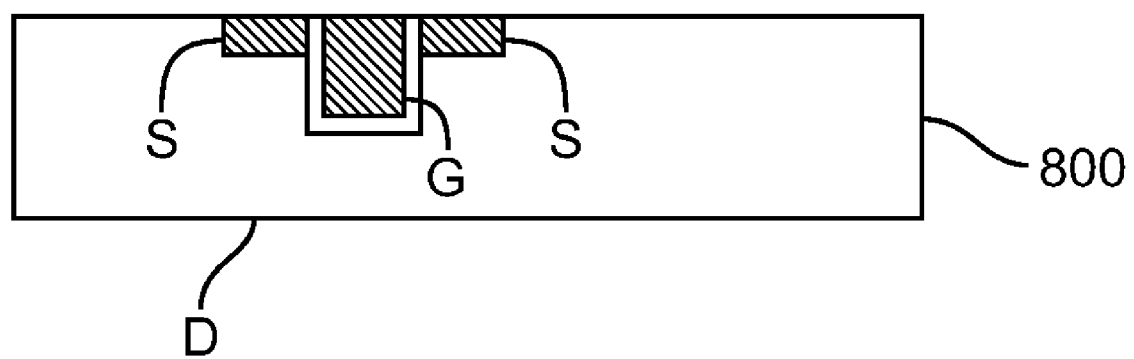
FIG. 21 shows a semiconductor die comprising a vertical MOSFET with a trenched gate.

The semiconductor dies used in the semiconductor packages according to preferred embodiments of the invention include vertical power transistors. Vertical power transistors include VDMOS transistors. A VDMOS transistor is a MOSFET that has two or more semiconductor regions formed by diffusion. It has a source region, a drain region, and a gate. The device is vertical in that the source region and the drain region are at opposite surfaces of the semiconductor die. The gate may be a trenched gate structure or a planar gate structure, and is formed at the same surface as the source region. Trenched gate structures are preferred, since trenched gate structures are narrower and occupy less space than planar gate structures. During operation, the current flow from the source region to the drain region in a VDMOS device is substantially perpendicular to the die surfaces. An example of a semiconductor die 800 comprising a vertical MOSFET with a trenched gate is shown in FIG. 21. Other devices that may be present in a semiconductor die may include diodes, BJT (bipolar junction transistors) and other types of electrical devices.

Referring again to FIG. 3, part of the leadframe 214 may be etched to allow the molding material 13 to lock to the leadframe. As shown in FIG. 3, the gate lead structure 11 has a gate pad 31 and a partially etched region 31(a) for locking. The source lead structure 214(a) has an exposed source pad 14 with an exposed source pad surface 14(a). The source pad surface 14(a) is also defined by a partially etched region 34 for mold locking. The source pad surface 14(a) may be part of a protruding region that protrudes from the other portions of the source pad 14.

As shown in FIG. 4, the drain clip 15 may also be partially etched, and may have a partially etched region 311 to allow the molding material 13 to lock to the drain clip 15. The drain pad surface 15(a) may be part of a protruding region that protrudes from the other portion of the source pad.

Any suitable etching process may be used to etch the leadframe and/or the clip 15, and etching may occur to any suitable depth. Suitable etching processes may include wet or dry etching processes. In some embodiments, the leadframe may be etched about one half way through the thickness of the leadframe. The etched leadframe maybe characterized as being half-etched under such circumstances.

Figure 5:
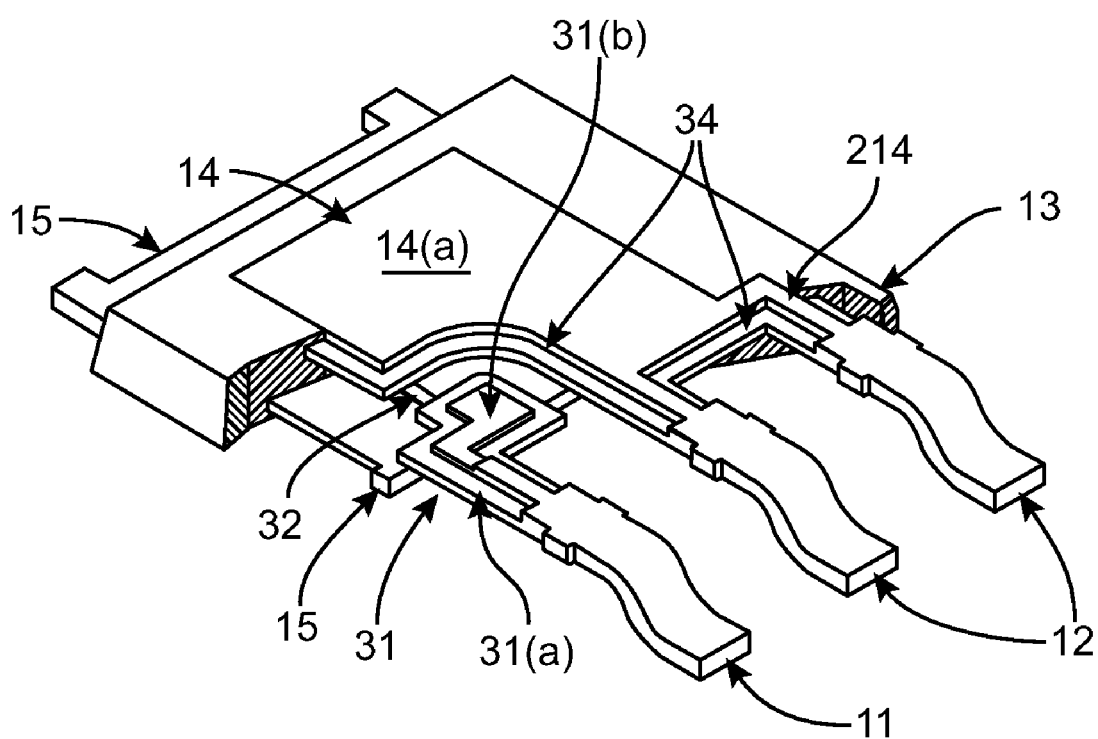
FIG. 5 shows a top perspective view of a semiconductor die package according to an embodiment of the invention with a portion of the molding material being removed.

FIG. 5 shows a top perspective view of the semiconductor die package 10 with a portion of the molding material 13 being removed. As shown, the molding material 13 may cover ledges forming the partially etched regions 31(a), 34 of the leadframe 214, without covering the source pad surface 14(a). The top exterior surface of the molding material 13 may be substantially coplanar with the source pad surface 14(a). As shown in FIG. 1, the molding material 13 may cover the top surface 31(b) of the gate pad 31. The top surface 31(b) of the gate pad 31 may be exposed, however, in other embodiments of the invention.

Figure 6:
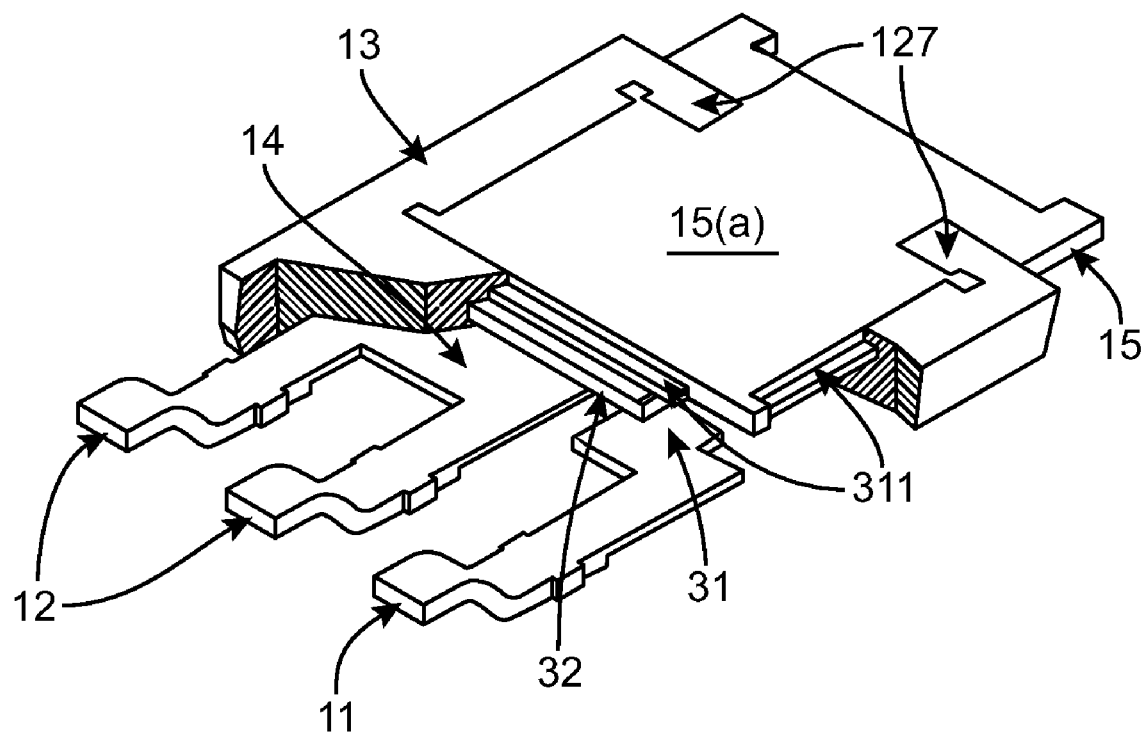
FIG. 6 shows a bottom perspective view of a semiconductor die package according to an embodiment of the invention with a portion of the molding material being removed.

FIG. 6 shows a bottom perspective view of the semiconductor die package with a portion of the molding material 13 being removed. FIG. 6 more clearly shows the partially etched region 311 of the clip 15. The molding material 13 may cover the surfaces of the partially etched region 311, but does not cover the drain surface 15(a). The drain surface 15(a) can be substantially coplanar with the bottom exterior surface of the molding material 13. As shown, the clip 15 may also have lateral grooves 127 improve the locking of the molding material 13 to the clip 15.

Figure 7:
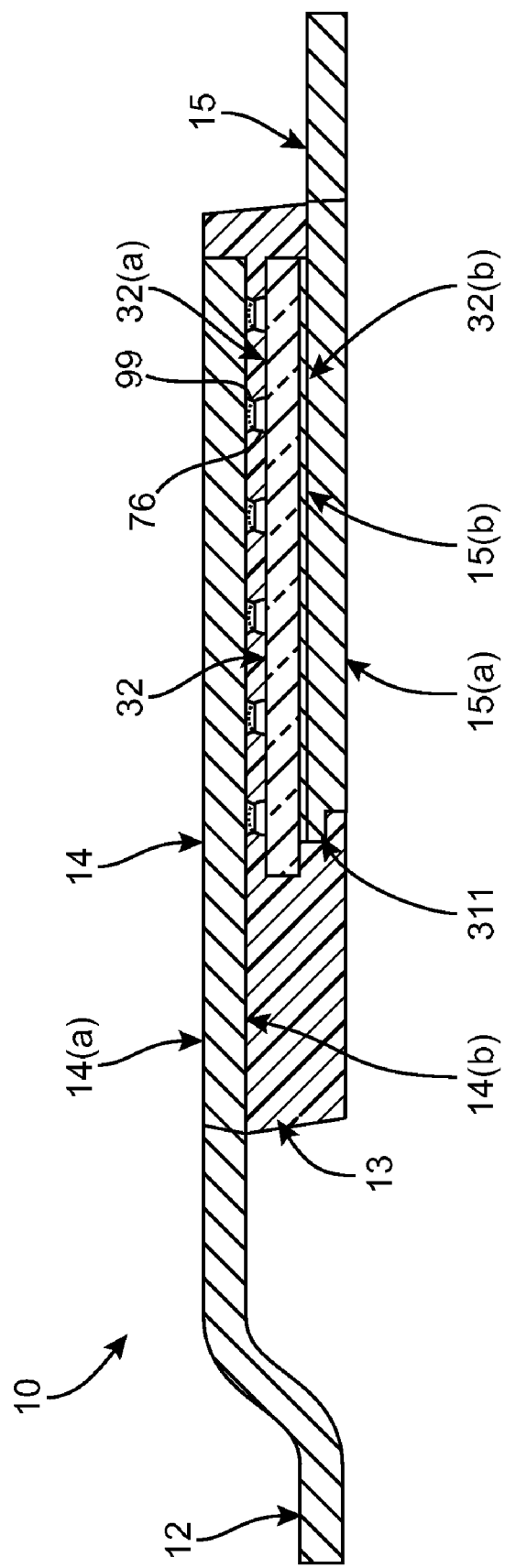
FIG. 7 shows a side cross-sectional view of a semiconductor die package according to an embodiment of the invention.

FIG. 7 is a cross-sectional view of the semiconductor die package. FIG. 7 more clearly shows solder bumps 76 coupling a first surface 32(a) of the semiconductor die 32 to the source pad 14. Solder paste 99 may contact the solder bumps 76 and the source pad 14. The semiconductor die 32 may also comprise a second surface 32(b) that is coupled to the drain clip 15. Solder can also be used to couple a second surface 15(b) of the drain clip 15 to the second surface 32(b) of the semiconductor die 32. The molding material 13 does not cover the top first surface 14(a) of the source pad 14 and the bottom surface of the clip 15, and further fills in the partially etched region 311 to allow the molding material 13 to lock to the drain clip 15. As shown in FIG. 7, the bottom surface 15(a) of the clip 15 is also substantially coplanar with the bottom surface of the molding material 13. In this example, source leads 12 extend from one side of the semiconductor die package, while the drain clip 15 extends from the opposite side of the semiconductor die package.

The solder bumps 76 and the solder paste 99 may have different melting temperatures in some embodiments of the invention, and any suitable solder material may be used including Pb based solder and lead free solder materials. That is, the solder provided by solder bumps 76 and solder paste 99 may comprise a high temperature solder material and a low temperature solder material. Other types of conductive adhesives such as conductive epoxies may also be used to electrically and mechanically couple parts in the package 10 together.

Figure 8:
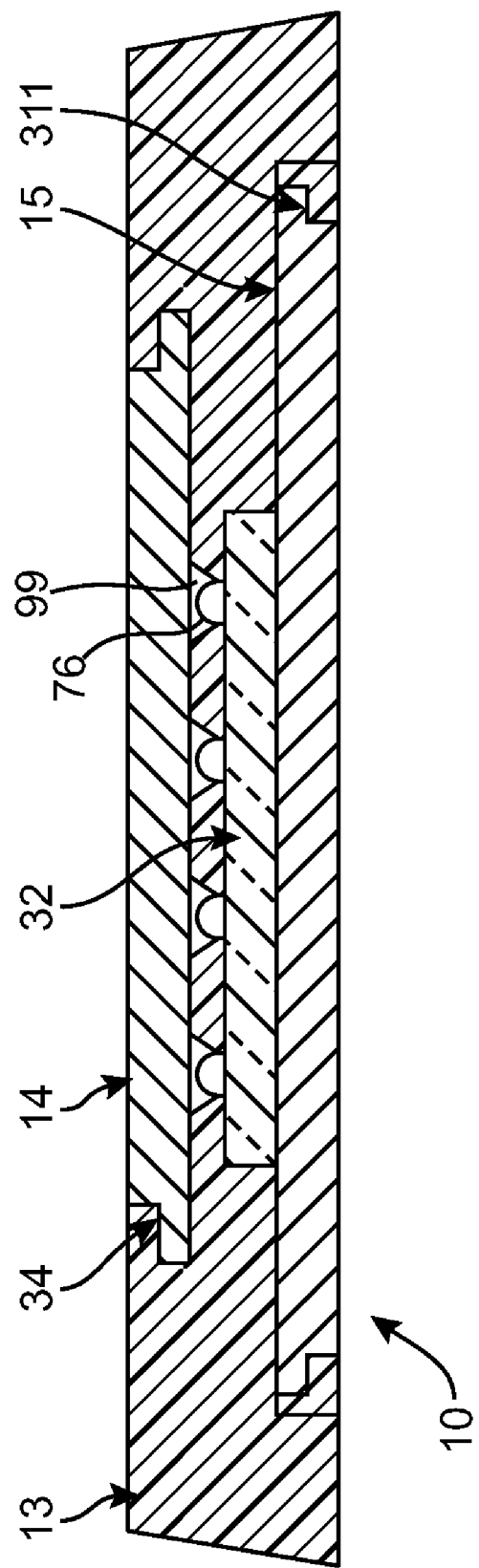
FIG. 8 shows a front cross-sectional view of a semiconductor die package according to an embodiment of the invention.

FIG. 8 shows a front cross-sectional view of the semiconductor die package 10 in FIG. 7. FIG. 8 additionally shows a partially etched region 34 of the source pad 14, and the molding material 13 filling in the partially etched region 34 to provide for molding locking.

Figure 9:
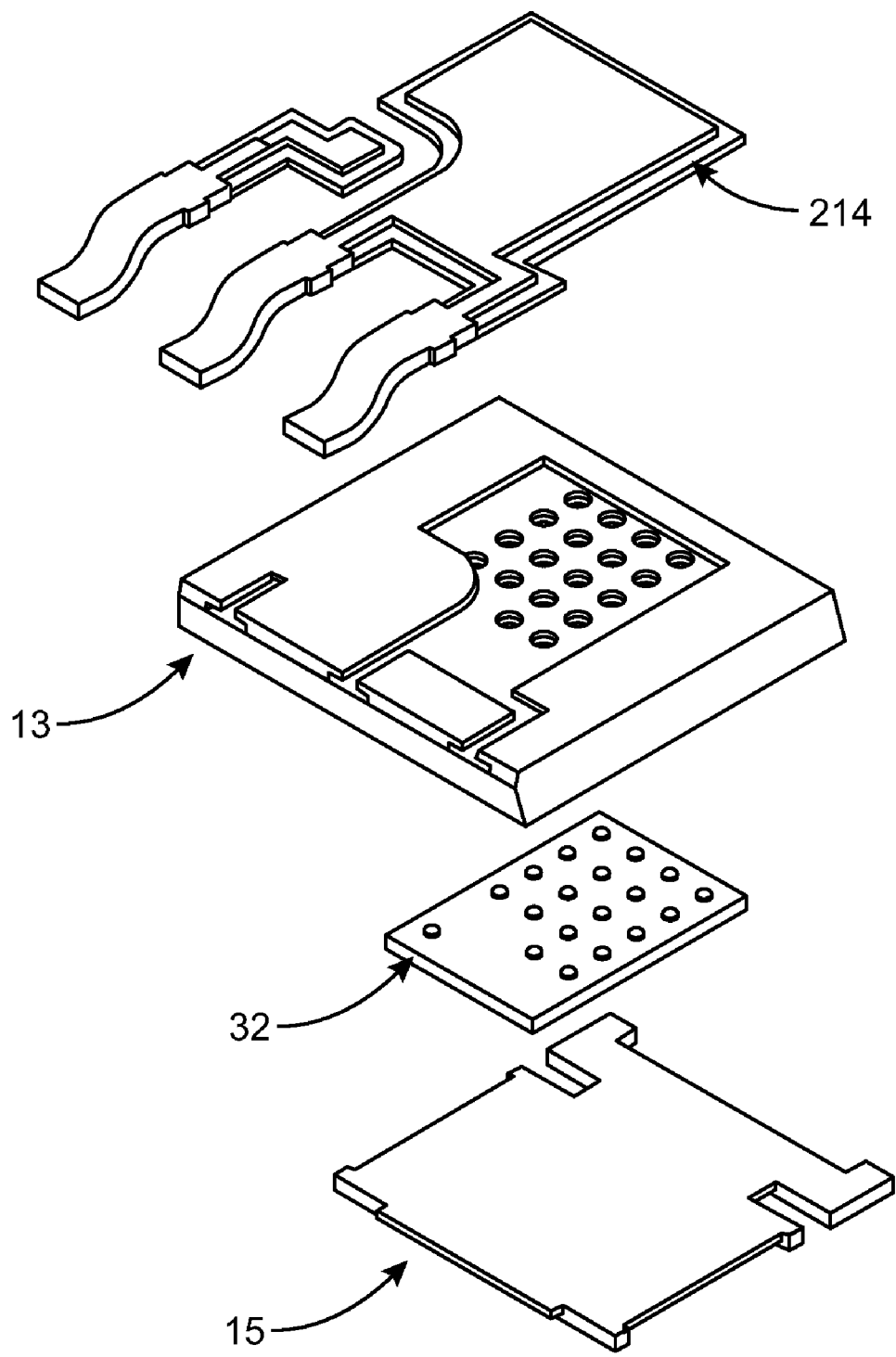
FIG. 9 shows an exploded view of a semiconductor die package according to an embodiment of the invention.

FIG. 9 shows an exploded view of the previously described leadframe 214, molding material 13, semiconductor die 32, and the clip 15.

Figure 10:
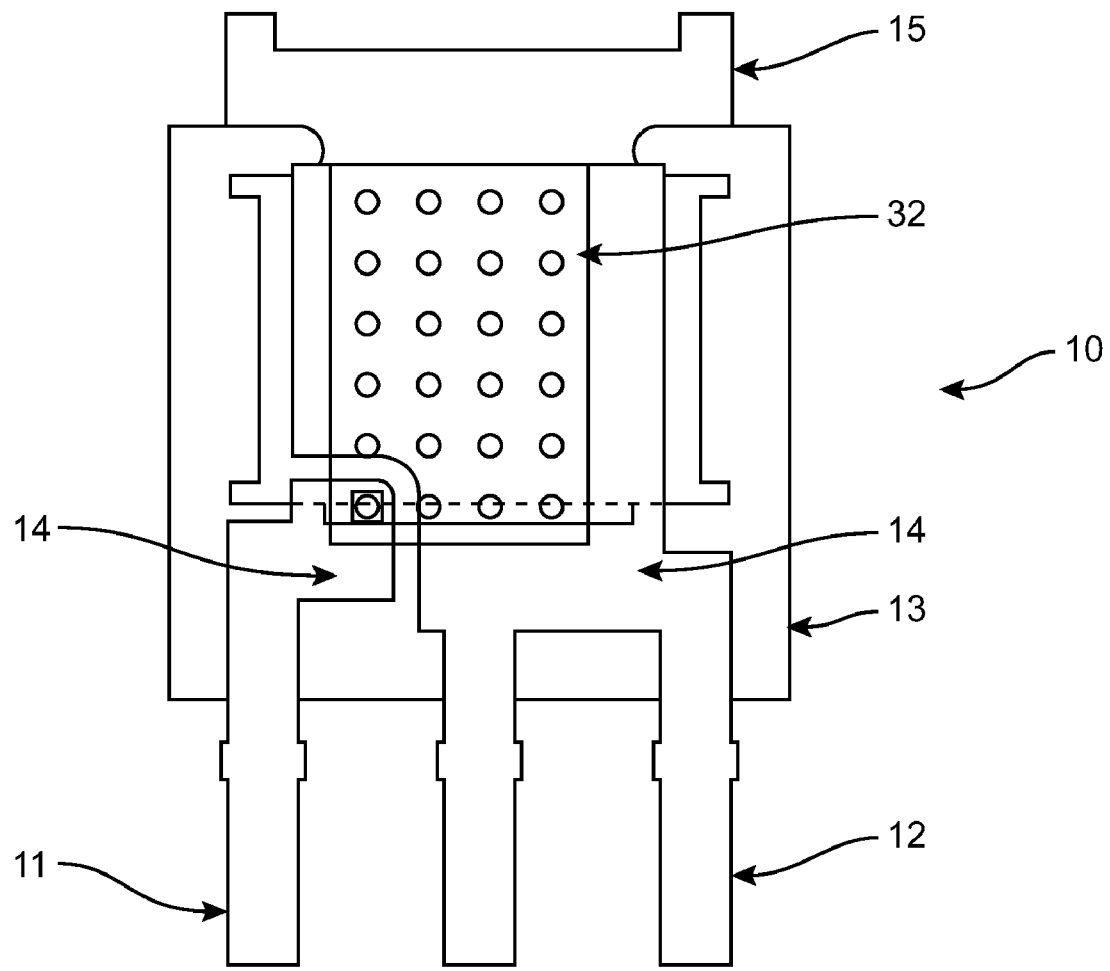
FIG. 10 shows a top view of a semiconductor die package according to an embodiment of the invention.

FIG. 10 shows a top view of the semiconductor die package 10.

A method for forming the above described semiconductor die package can now be described. In one embodiment, the method may comprise obtaining a semiconductor die comprising an input at a first top semiconductor die surface and an output at a second bottom semiconductor die surface, and attaching a leadframe having a first leadframe surface and a second leadframe surface opposite the first leadframe surface to the semiconductor die. The second leadframe surface is coupled to the first top semiconductor die surface. A clip having a first clip surface and a second clip surface is attached to the semiconductor die before or after the semiconductor die is attached to the second leadframe surface. In any event, the second clip surface is coupled to the second bottom semiconductor die surface, and a molding material is molded around at least a portion of the leadframe, the clip, and the semiconductor die, wherein after molding, the first leadframe surface and the first clip surface are exposed by the molding material, and wherein the first leadframe surface, the first clip surface, and the exterior molding material surfaces of the molding material form exterior surfaces of the semiconductor die package.

Figure 11:
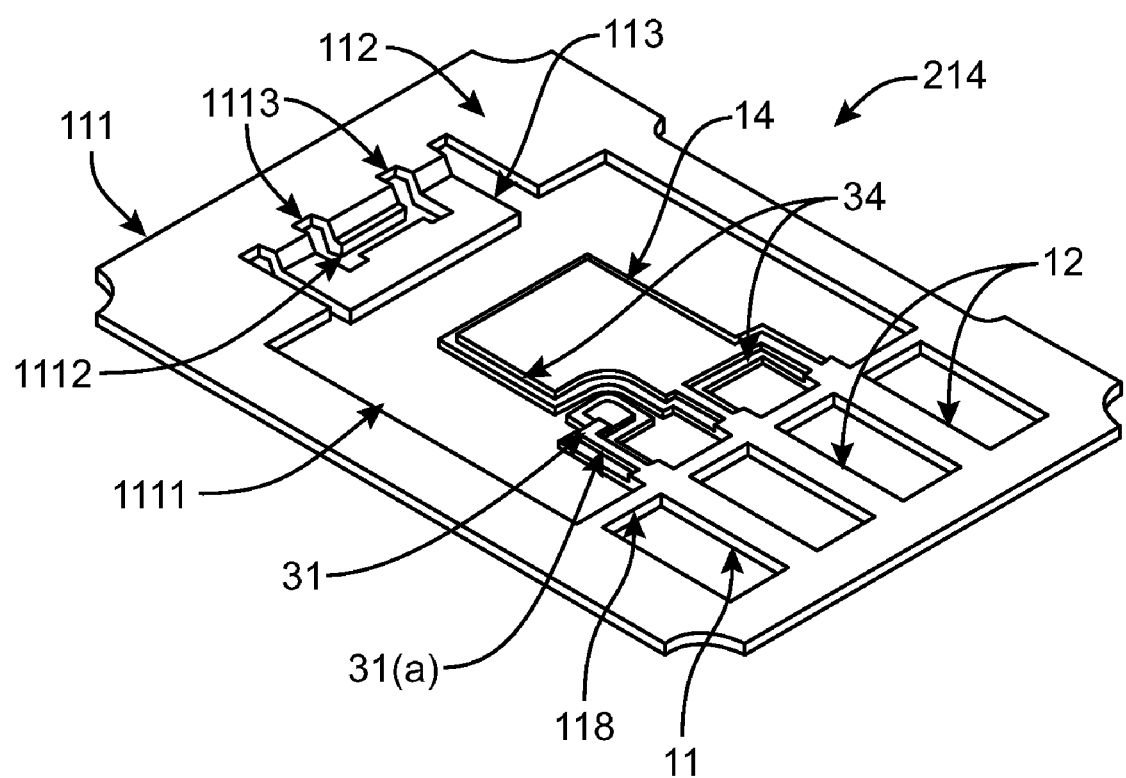
FIG. 11 shows a top perspective view of a leadframe structure attached to a frame.

A leadframe can be obtained from any suitable precursor structure, which may be formed by any suitable process including stamping, etching, or any suitable combination of such processes. FIG. 11 shows a top perspective view of a leadframe precursor structure 111 according to an embodiment of the invention. It includes a lifted anvil 113 at a first end of the leadframe precursor structure 111 attached to a frame 112. The frame 112 may define a frame window 1111 for molding. The upper surface of the anvil 113 may lie in a different plane and may be downset with respect to the upper surface of the frame 112. A horizontal slot 1112 is parallel to the orientation of the anvil 113 and two vertical locator slots 1113 on opposite ends of the horizontal slot 1112. The vertical slots 1113 will be used for thermal drain clip hook positioning.

The leadframe precursor structure 1111 also includes a source lead structure including a source pad 14 and integral source leads 12, and a gate lead structure including a gate pad 31 and an integral gate lead 11, attached to the frame 112 via tie bars 118 at a second end opposite the first end. As in prior FIGS., partially etched regions 34 and 31(a) are shown in the source pad 14 and the gate pad 31, respectively.

Figure 12:
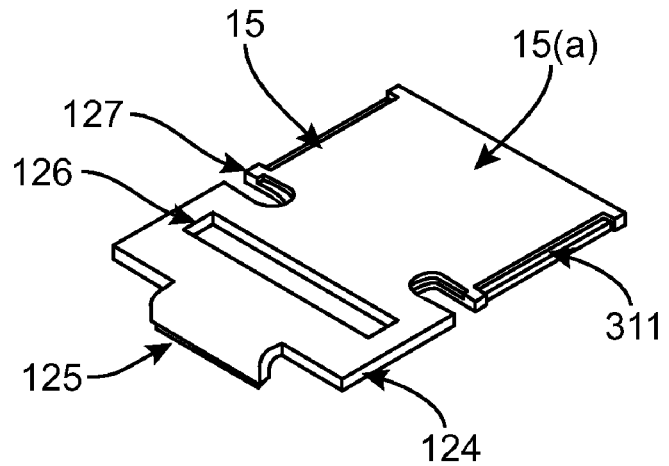
FIG. 12 shows a bottom perspective view of a thermal drain clip.

FIG. 12 shows a perspective view of the drain clip 15. It includes a drain clip surface 15(a), and slotted regions 127 for mold locking, as well as a relief slot 126 for cutting in a singulation process. It also includes a thermal clip locator hook 125 extending from a thermal clip pad 124. The drain clip 15 can be formed by any suitable process including etching and stamping.

Figure 13:
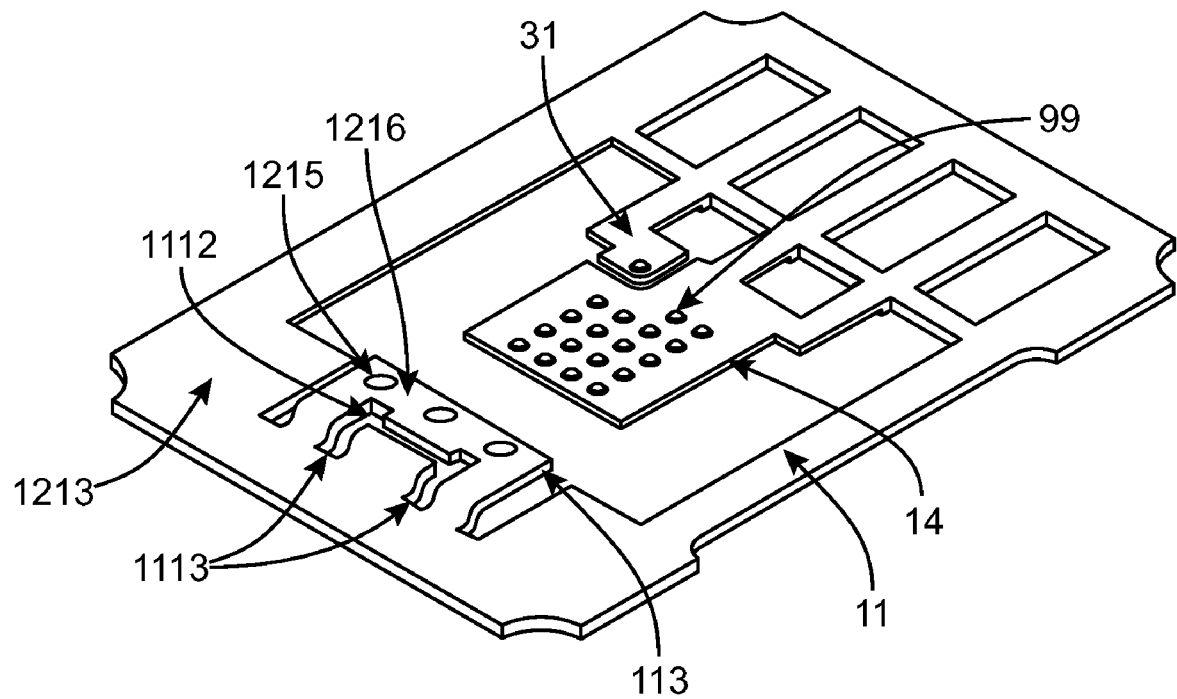
FIG. 13 shows a bottom perspective view of an internal frame die attach pad area.

FIG. 13 shows the leadframe precursor structure 111 in FIG. 11, flipped over. FIG. 13 shows a support area 1216 for the clip 15 on the anvil 113. Solder paste 1215 is on the support area 1216. Solder paste 99 is also deposited on the internal surfaces of the gate pad and the source pad. A flat frame surface 1213 is also present in the leadframe precursor structure 111.

Figure 14:
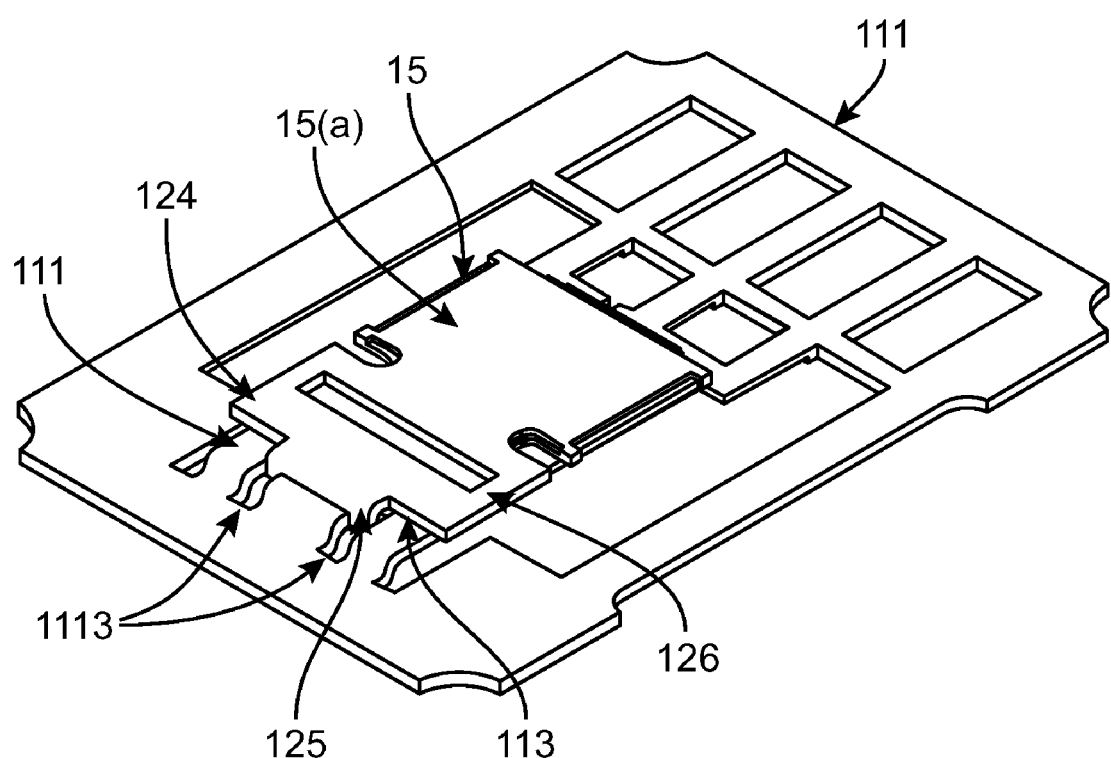
FIG. 14 shows a bottom perspective view of an assembled frame with an attached thermal drain clip.
Figure 15:
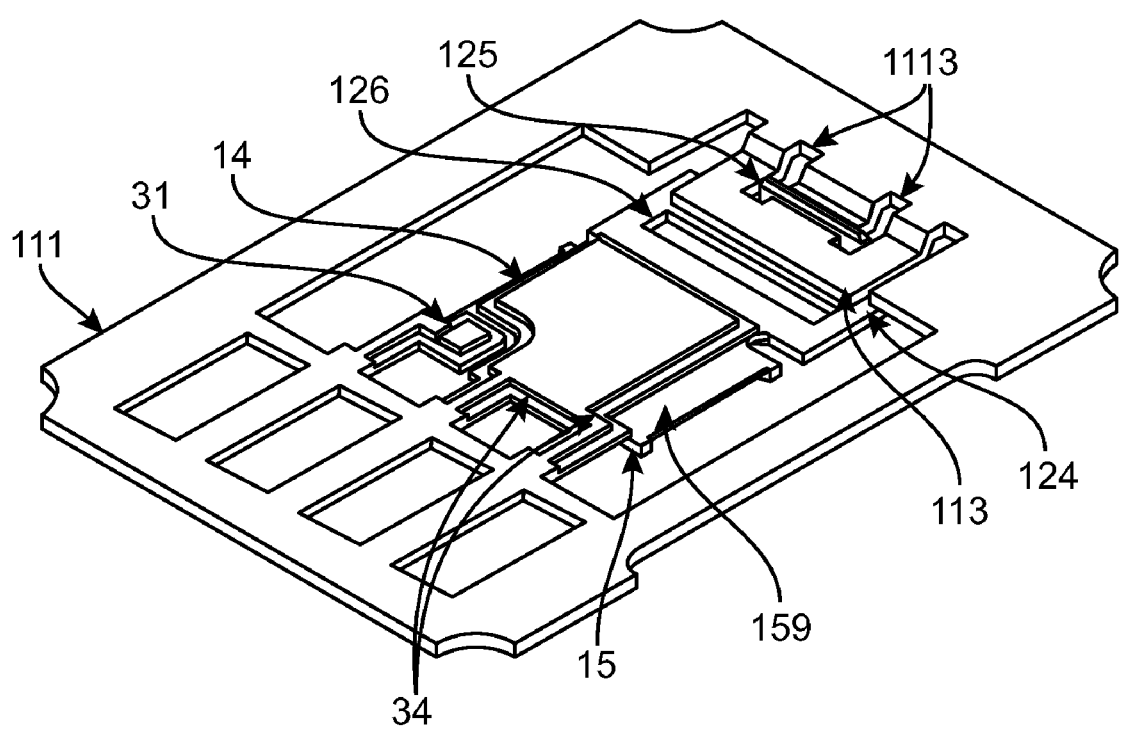
FIG. 15 is a top perspective view of an assembled frame with an attached thermal drain clip.

FIG. 14 shows a perspective bottom view of an assembled frame with an attached thermal drain clip. FIG. 15 shows a top perspective view of the assembled frame with an attached drain clip. FIG. 15 also shows a thermal die attach clip pad 159. FIG. 18 shows a cross-sectional view of the assembly shown in FIGS. 16-17. FIG. 18 additionally shows a conductive adhesive (e.g., solder) 186 coupling the die 32 to the drain clip 15, and a setting point 1710 between the clip 15 and the anvil 113.

As shown in FIG. 14, the clip 15 can be placed on the source and gate pads so that the hook 125 fits into the horizontal slot 1112. Opposite edges defining the vertical slots 1113 restrict the lateral movement of the hook 125, thereby stabilizing the lateral and vertical positioning of the clip 15, relative to the source and gate pads 14, 31 (See FIG. 15). As shown in prior Figures, a semiconductor die 32 is sandwiched between the source and gate pads 14, 31, and the drain clip 15. The semiconductor die 32 may have been bumped with solder using conventional solder deposition processes.

Figure 16:
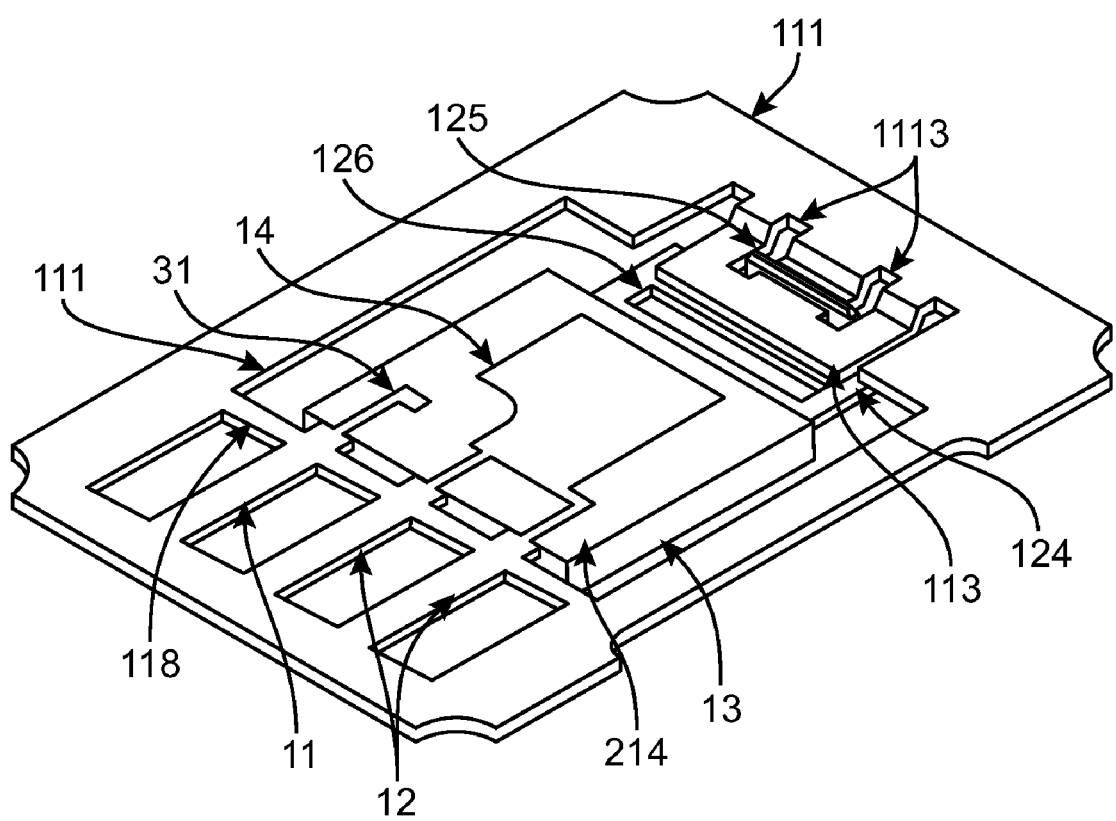
FIG. 16 is a top perspective view of an assembled frame with an attached thermal drain clip, after molding.
Figure 17:
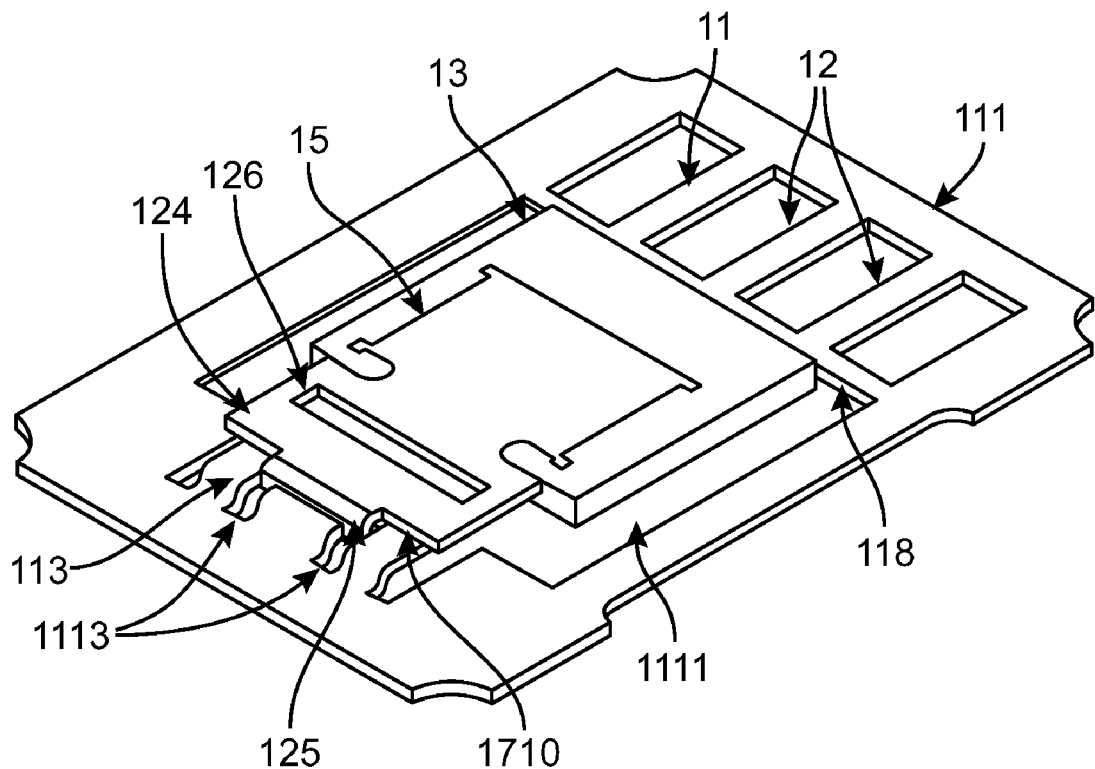
FIG. 17 is a bottom perspective view of an assembled frame with an attached thermal drain clip, after molding.
Figure 18:
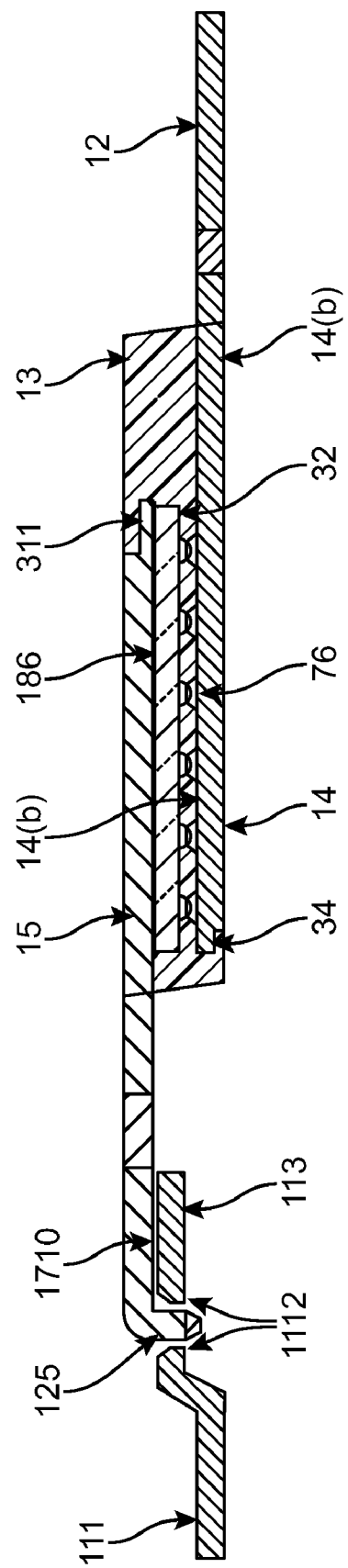
FIG. 18 is a side, cross-sectional view of an embodiment of the invention after assembly and molding.

As shown in FIGS. 16 and 17, after attaching a semiconductor die 32 to the precursor 111 and the clip 15, a molding material 113 can be formed so that it covers at least a portion of the semiconductor die 32, the frame 214 in the precursor 111, and the clip 15. As shown in FIG. 16, the top surfaces of the source pad 14, gate lead 11, and source leads 12, are exposed by the molding material 13, and may be substantially coplanar with the top exterior surface of the molding material 13. As shown in FIG. 17, the bottom surface of the drain clip 15 is substantially coplanar with the bottom surface of the molding material 13. The molding material 13 lies within a frame window 179 formed by the leadframe precursor 111.

Molding may occur using any suitable molding tool or molding process. In an exemplary embodiment, the molding tool may have two molding dies, where surfaces of the molding dies contact surfaces of the leadframe and the clip so that they are not covered with molding material during the molding process. Any suitable molding temperatures and pressures may be used in embodiments of the invention.

After molding, referring to FIGS. 16-17, the leads 11, 12 as well as the portion of clip 15 with the slot 124 may be cut with a saw or the like. The leads 11, 12, may then be bent (if they are not already bent) to form the semiconductor die package.

Although one semiconductor die package is shown, the semiconductor die package may be formed in an array.

Figure 19B:
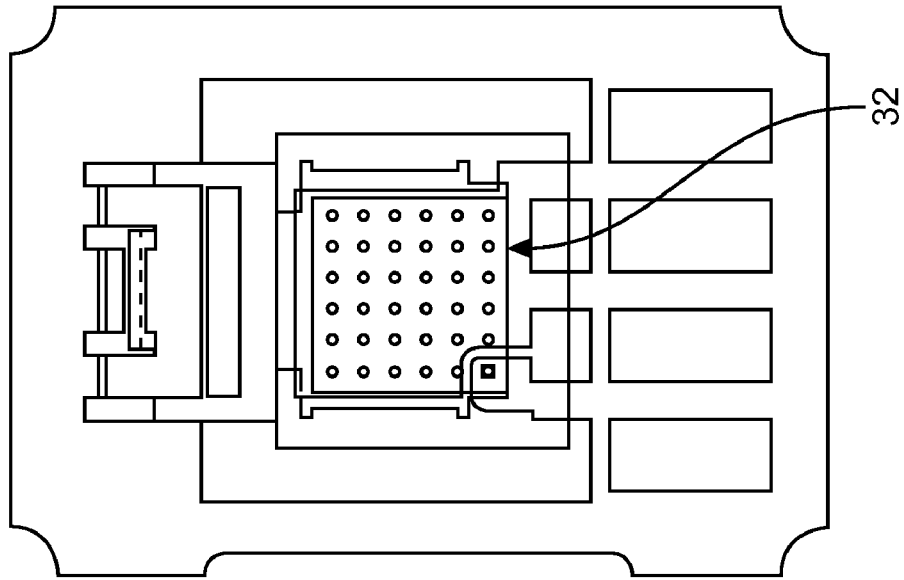
FIGS. 19(a) and 19(b) show die bonding and layouts.
Figure 19A:
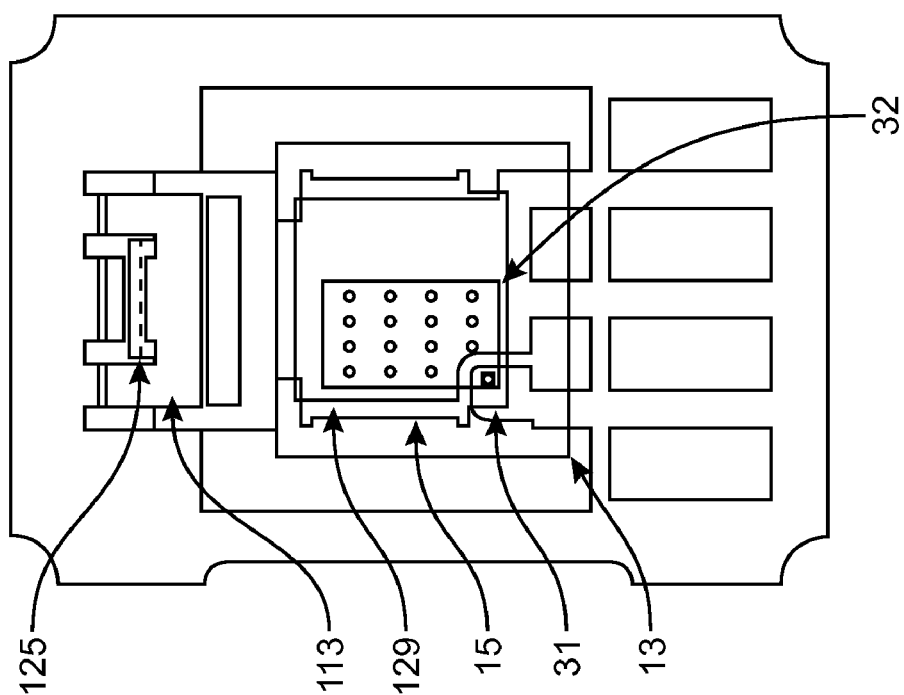

FIGS. 19(a)-19(b) show top plan views of assemblies like those shown in FIGS. 16-18, which two different die sizes. FIG. 19(a) shows a die size of 2.66 mm×3.66 mm. FIG. 19(b) shows a die size of 4 mm×4 mm. Accordingly, as shown in FIGS. 19(a)-19 (b), embodiments of the invention may incorporate any suitable die size, or type of die.

FIGS. 20(a)-20(k) show portions of a semiconductor die package as it is being formed. Many of the steps in FIGS. 20(a)-20(k) have been described above, and the descriptions are applicable here.

FIGS. 20(a)-20(k) show the following: FIG. 20(a) shows a thermal drain clip 15; FIG. 20(b) shows a die 32 being attached to the thermal drain clip 15 using a soft solder and die attach process (using reflow); FIGS. 20(c)-20(d) show a structure formed after singulation and subsequent placement (by flipping) of the clip 15 and die 32 combination onto a leadframe precursor 111; FIG. 20(e) shows a structure formed after a reflow process is performed, wherein the die 32, the clip 15, and the precursor 111 are joined together; FIG. 20(f) shows a structure formed after a film assisted molding process is performed, whereby a molding material 13 is formed around selected parts of the package; FIG. 20(g) shows a structure formed after a water jet deflash process is performed; FIG. 20(h) shows a structure formed after a laser marking process is performed, whereby the die package can be laser marked for identification purposes; FIG. 20(i) shows a structure formed after a singulation process is performed, whereby the package can be separated from other packages in an array; FIG. 20(j) shows a structure formed after a unit test step is performed; and FIG. 20(k) shows a structure formed just prior to a pack and ship step.

Embodiments of the invention have a number of advantages. Embodiments of the invention may have some, none or all of the following advantages. First, by exposing portions of the leadframe and clip through the molding material, the packages are quite thin and can be used in thin devices such as wireless phones, PDAs, etc. Second, since larger surfaces of the clip and the leadframe are exposed, heat can easily dissipate from a semiconductor die within a semiconductor die package according to an embodiment of the invention. Third, bigger die sizes can be mounted using the same standard footprint. Fourth, as noted above, a clip can be properly aligned with a die and a leadframe using a hook, thereby reducing potential alignment errors during manufacturing. Fifth, no deflash process and plating processes are needed if a pre-plated frame is used. Sixth, embodiments of the invention are flexible and can use both copper stud bumping and electroless NiAu bumps as well. Such bumps may be present on the previously described dies. Seventh, embodiments of the invention are robust and can be used in applications such as automotive applications. Eighth, there is no need to use a film assisted mold process since both sides of the package can be in metal-to-metal contact with the surfaces of a mold cavity.

As used herein "top" and "bottom" surfaces are used in the context of relativity with respect to a circuit board upon which the semiconductor die packages according to embodiments of the invention are mounted. Such positional terms may or may not refer to absolute positions of such packages.

The semiconductor die packages described above can be used in electrical assemblies including circuit boards with the packages mounted thereon. They may also be used in systems such as phones, computers, etc.

Any recitation of "a", "an", and "the" is intended to mean one or more unless specifically indicated to the contrary.

The terms and expressions which have been employed herein are used as terms of description and not of limitation, and there is no intention in the use of such terms and expressions of excluding equivalents of the features shown and described, it being recognized that various modifications are possible within the scope of the invention claimed.

Moreover, one or more features of one or more embodiments of the invention may be combined with one or more features of other embodiments of the invention without departing from the scope of the invention.

All patents, patent applications, publications, and descriptions mentioned above are herein incorporated by reference in their entirety for all purposes. None is admitted to be prior art.

What is claimed is:

1. A semiconductor die package comprising:
   a mounting surface adapted to be mounted to a printed circuit board;
   a semiconductor die comprising an input at a first top semiconductor die surface and an output at a second bottom semiconductor die surface, the second bottom semiconductor die surface facing toward the mounting surface and the first top semiconductor die surface facing away from the mounting surface;
   a leadframe having a first leadframe surface and a second leadframe surface opposite the first leadframe surface, wherein the second leadframe surface is coupled to the first top semiconductor die surface using a reflowable solder, the leadframe further having at least one lead with a portion coplanar with the mounting surface;
   a clip disposed at the mounting surface, between the semiconductor die and the mounting surface, and having a first clip surface and a second clip surface, wherein the second clip surface is coupled to the second bottom semiconductor die surface; and
   a molding material having exterior molding material surfaces and covering at least a portion of the leadframe, the clip, and the semiconductor die,
   wherein the first leadframe surface and the first clip surface are exposed by the molding material, and wherein the first leadframe surface, the first clip surface, and the exterior molding material surfaces of the molding material form exterior surfaces of the semiconductor die package.

2. The semiconductor die package of claim 1 wherein the semiconductor die comprises a vertical device.

3. The semiconductor die package of claim 1 wherein the first leadframe surface defines a protruding leadframe portion of the leadframe.

4. The semiconductor die package of claim 3 wherein the first clip surface defines a protruding clip portion of the clip.

5. The semiconductor die package of claim 4 wherein exterior surfaces of the molding material are substantially coplanar with the first clip surface and the first leadframe surface, and wherein the molding material covers edges of the protruding leadframe portion and the protruding clip portion.

6. The semiconductor die package of claim 1 wherein the solder comprises a high temperature solder material and a low temperature solder material.

7. The semiconductor die package of claim 1 wherein the semiconductor die comprises a trenched gate.

8. The semiconductor die package of claim 1 wherein the leadframe comprises copper or a copper alloy.

9. A system comprising the semiconductor die package of claim 1.

10. The semiconductor die package of claim 1, wherein the clip is flat.

11. The semiconductor die package of claim 1, wherein the clip comprises an edge with a region removed therefrom at the first clip surface.

12. The semiconductor die package of claim 11, wherein a portion of the molding material is disposed in the removed region.

13. The semiconductor die package of claim 1, wherein the reflowable solder consists of an alloy of metals.

14. The semiconductor die package of claim 1, wherein the leadframe and the clip are plated with under-bump metallurgy layers.

15. The semiconductor die package of claim 1, wherein at least one lead of the leadframe extends out of the molding material from a first end of the semiconductor die package with its end being coplanar with the first clip surface, and
wherein a portion of the clip extends out of the molding material from a second end of the semiconductor die package which is opposite to the first end of the semiconductor die package.

16. A method for forming a semiconductor die package, the method comprising:
obtaining a semiconductor die comprising an input at a first top semiconductor die surface and an output at a second bottom semiconductor die surface;
attaching a leadframe having a first leadframe surface and a second leadframe surface opposite the first leadframe surface to the semiconductor die using reflowable solder, wherein the second leadframe surface is coupled to the first top semiconductor die surface;
attaching a clip having a first clip surface and a second clip surface, wherein the second clip surface is coupled to the second bottom semiconductor die surface; and
molding a molding material around at least a portion of the leadframe, the clip, and the semiconductor die,
wherein after molding, the first leadframe surface and the first clip surface are exposed by the molding material, wherein the first clip surface and an exterior surface of the molding material form an exterior mounting surface of the semiconductor die package, the mounting surface adapted to be mounted to a printed circuit board, wherein the first leadframe surface and another exterior surface of the molding material form another exterior surface of the package, wherein the second bottom semiconductor die surface faces toward the exterior mounting surface and the first top semiconductor die surface facing away from the exterior mounting surface, wherein at least one lead of the leadframe has a portion coplanar with the exterior mounting surface, and wherein the clip is disposed at the mounting surface, between the semiconductor die and the mounting surface.

17. The method of claim 16 wherein attaching the clip to the semiconductor die comprises using solder to attach the clip to the semiconductor die.

18. The method of claim 16 further comprising, prior to attaching the leadframe to the semiconductor die, partially etching the leadframe to form a protruding portion comprising the first leadframe surface.

19. The method of claim 18 further comprising, prior to attaching the clip to the semiconductor die, partially etching the clip to form a protruding portion comprising the first clip surface.

20. The method of claim 18 wherein molding comprises using a molding tool with molding dies that contact surfaces of the clip and the leadframe.

21. The method of claim 18 wherein the semiconductor die comprises a vertical MOSFET.

22. The method of claim 18 wherein the leadframe comprises copper.

23. The method of claim 18 wherein attaching the leadframe to the semiconductor die occurs after attaching the clip to the semiconductor die.

24. The method of claim 18 wherein the semiconductor die package is in an array of semiconductor die packages when the semiconductor die package is formed.

25. The method of claim 16 wherein the leadframe is provided by a leadframe precursor structure that has a slot;
wherein the clip further comprises a locator hook; and
wherein attaching the clip comprises fitting the locator hook in the slot.

* * * * *